US00RE47083E

(19) United States
(12) Reissued Patent
Gaalaas et al.

(10) Patent Number: US RE47,083 E
(45) Date of Reissued Patent: *Oct. 9, 2018

(54) USB ISOLATOR WITH ADVANCED CONTROL FEATURES

(71) Applicant: Analog Devices, Inc., Norwood, MA (US)

(72) Inventors: Eric C. Gaalaas, Bedford, MA (US); Mark Stewart Cantrell, Windham, NH (US)

(73) Assignee: Analog Devices, Inc., Norwood, MA (US)

( * ) Notice: This patent is subject to a terminal disclaimer.

(21) Appl. No.: 14/697,524

(22) Filed: Apr. 27, 2015

Related U.S. Patent Documents

Reissue of:
(64) Patent No.: 8,432,182
Issued: Apr. 30, 2013
Appl. No.: 12/504,153
Filed: Jul. 16, 2009

U.S. Applications:
(60) Provisional application No. 61/164,672, filed on Mar. 30, 2009.

(51) Int. Cl.
*H03K 19/003* (2006.01)

(52) U.S. Cl.
CPC ..... *H03K 19/003* (2013.01)

(58) Field of Classification Search
CPC ..... H03K 19/003
USPC ..... 326/21, 30; 370/43
See application file for complete search history.

(56) References Cited

U.S. PATENT DOCUMENTS 5,465,070 A 11/1995 Koyama et al.
6,262,600 B1 7/2001 Haigh et al.
6,525,566 B2 2/2003 Haigh et al.
6,675,250 B1 1/2004 Ditner et al.
6,720,816 B2 4/2004 Strzalkowski
6,813,672 B1 * 11/2004 Kamran et al. ..... 710/305
(Continued)

FOREIGN PATENT DOCUMENTS

CN 1290443 A 4/2001
CN 1440254 A 9/2003
CN 2753062 Y 1/2006

OTHER PUBLICATIONS

Supplementary European Search Report and European Search Opinion issued in European Application No. 10762125.2, communication dated Aug. 27, 2014, 7 pages.
(Continued)

*Primary Examiner* — My-Trang Ton
(74) *Attorney, Agent, or Firm* — Wolf, Greenfield & Sacks, P.C.

(57) ABSTRACT

A USB-based isolator system conveys USB signals between a pair of galvanically isolated circuit systems and supports controlled enumeration by a downstream device on upstream USB signal lines. The isolator system provides a multi-mode voltage regulator to support multiple voltage supply configurations. The isolator system further provides control systems for each of the isolated circuit systems and provides robust control in a variety of start up conditions. Additionally, the isolator system includes refresh timers and watchdog mechanisms to support persistent operation but manage possible communication errors that can arise between the isolated circuit systems.

31 Claims, 8 Drawing Sheets

(56) References Cited

U.S. PATENT DOCUMENTS

| | | | | |
|---|---|---|---|---|
| 6,820,160 | B1 | 11/2004 | Allman | G06F 13/4072 710/305 |
| 6,873,065 | B2 | 3/2005 | Haigh et al. | |
| 6,903,578 | B2 | 6/2005 | Haigh et al. | |
| 6,922,080 | B2 | 7/2005 | Haigh et al. | |
| 7,075,329 | B2 | 7/2006 | Chen et al. | |
| 7,545,059 | B2 | 6/2009 | Chen et al. | |
| 7,899,968 | B2 * | 3/2011 | Bliss | G06F 13/4027 710/110 |
| 8,432,182 | B2 | 4/2013 | Gaalaas et al. | |
| 2002/0153940 | A1 * | 10/2002 | Wurcer et al. | 327/536 |
| 2003/0042571 | A1 | 3/2003 | Chen et al. | |
| 2005/0027889 | A1 | 2/2005 | Sandulescu | |
| 2006/0053244 | A1 * | 3/2006 | Fruhauf et al. | 710/313 |
| 2006/0190748 | A1 | 8/2006 | Lim et al. | |
| 2006/0209938 | A1 | 9/2006 | Chen | |
| 2006/0250155 | A1 | 11/2006 | Chen et al. | |
| 2006/0265540 | A1 * | 11/2006 | Mass et al. | 710/305 |
| 2007/0258513 | A1 | 11/2007 | Strzalkowski | |
| 2008/0136442 | A1 | 6/2008 | Chen | |
| 2008/0169834 | A1 | 7/2008 | Chen et al. | |
| 2008/0267212 | A1 | 10/2008 | Crawley et al. | |
| 2009/0031056 | A1 | 1/2009 | Bliss et al. | |
| 2009/0213914 | A1 | 8/2009 | Dong et al. | |
| 2009/0295451 | A1 | 12/2009 | Jordanger et al. | |
| 2010/0250820 | A1 | 9/2010 | Gaalaas et al. | |

OTHER PUBLICATIONS

U.S. Appl. No. 14/697,528, filed Apr. 27, 2015, Gaalaas et al.

U.S. Appl. No. 14/697,532, filed Apr. 27, 2015, Gaalaas et al.

International Search Report dated Jul. 21, 2010, in counterpart international application No. PCT/US2010/028802.

Lane Hauck, "Isolating USB", Maxim Integrated Products, Jul. 6, 2006, EDN 63.

"iCoupler Digital Isolater", ADuM1100, Analog Devices Inc.,2007, pp. 1-20. C02462-0-6/07(G).

"Hot Swappable Dual I2C Isolators: ADuM1250/ADuM1251", Analog Devices, Inc., 2007. pp. 1-12, D06113-0-6/07(A).

"Isolating USB", Maxim Integrated Products, Sep. 22, 2006, pp. 1-8.

"USB isolator—galvanic isolation between PC and USB devices", USB interface technology, p. 89.

"USB Peripheral Controller with SPI Interface", Maxim Integrated Products, 2007, pp. 1-25, 19-3781; Rev 2; Jun. 7.

Junnila, et al., "Medical Isolation of Universal Serial Bus Data Signals", Tarnpere University of Technology, Institute of Digital and Computer Systems, IEEE, pp. 1215-18, 0-7803-7596-3/02.

"ISOUSB-hv". USB-Isolator from IFTOOLS. Feb. 2009.

"TUSB1105, TUSB1106: Advanced Universal Serial Bus Transceivers", Texas Instruments Incorporated, pp. 1-33, SCAS818D—May 2006—Revised Feb. 2008.

"TUSB2036: ⅔-Port Hub for the Universal Serial Bus With Optional Serial Eeprom Interface", Texas Instruments Incorporated, Mar. 2000—Revised Nov. 2006, pp. 1-23, SLLS372C.

"Universal Serial Bus Specification: Revision 2.0", Compaq Hewlett-Packard, Intel, Lucent, Microsoft, NEC and Philips, Apr. 27, 2000, pp. 1-650.

"USB for Professional Applications: USB Isolator—USB-GT—Galvanic Isolation Between PC and USB Devices", www.meilhaus.com, p. 55.

* cited by examiner

100
TO/FROM DOWNSTREAM DEVICE
DD+
DD-
USB TX/RX 110.2
ACTIVITY
ENUMERATION ENABLE
P1
ISOLATOR TRANSC'V'R 130.2
RX
TX
TX 142
ISOLATOR DEVICE 120.1
ISOLATOR DEVICE 120.2
ISOLATOR DEVICE 120.3
ISOLATOR DEVICE 120.4
ISOLATOR DEVICE 140
DOWNSTREAM
ISOLATOR TRANSC'V'R 130.1
TX
RX
RX 144
UPSTREAM
USB TX/RX 110.1
UD-
UD+
SEL
P2
TERMINATION 150
SWITCH CONTROL 154
R
152.2
152.1
UD+
UD-
TO/FROM UPSTREAM DEVICE

TO/FROM DOWNSTREAM DEVICE

200
DD+
DD-
USB TX/RX 210.2
ENUMERATION ENABLE / SEL
ISOLATOR TRANSC'V'R 230.2
RX 234.2
TX 232.2
ENCODE 236
BIDIRECTIONAL ISOLATOR DEVICES
220.1
220.2
ISOLATOR TRANSC'V'R 230.1
TX 232.1
RX 234.1
DECODE 238
USB TX/RX 210.1
TERMINATION 250
SWITCH CONTROL 254
R
252.1
252.2
UD+
UD-
TO/FROM UPSTREAM DEVICE

400

500

600

700

800

900

1000

1100

USB ISOLATOR WITH ADVANCED CONTROL FEATURES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

*Notice: More than one reissue application has been filed for the reissue of U.S. Pat. No. 8,432,182. The reissue applications are: (1) U.S. patent application Ser. No. 14/697,524, filed Apr. 27, 2015, titled "USB Isolator With Advanced Control Features; (2) U.S. patent application Ser. No. 14/697,528, filed Apr. 27, 2015, titled "USB Isolator With Advanced Control Features; and (3) U.S. patent application Ser. No. 14/697,532, filed Apr. 27, 2015, titled "USB Isolator With Advanced Control Features, each of which is a reissue application of U.S. Pat. No. 8,432,182.*

This application *is a reissue application of U.S. application Ser. No. 12/504,153, filed Jul. 16, 2009, now U.S. Pat. No. 8,432,182, titled "USB Isolator with Advanced Control Features", which* claims priority under 35 U.S.C. §119 to U.S. Provisional Patent Application No. 61/164,672, filed on Mar. 30, 2009, and entitled "USB Isolator With Advanced Control Features," which is herein incorporated by reference in its entirety.

BACKGROUND

Isolators are devices that exchange data signals between two galvanically isolated circuit systems. The circuit systems each operate in different voltage domains, which may include different source potentials and different grounds. Isolation devices may provide data exchange across an isolation barrier, which maintains the galvanic isolation.

Isolation devices have been used for USB communication. These devices commonly include a USB receiver that receives data from a USB cable according to the USB protocol and transmits the received data across an isolation barrier. Although these USB isolators permit USB communication to traverse an isolation barrier, known devices are limited. For example, no known USB isolator performs controlled enumeration or adequately communicates status between upstream and downstream circuit systems. Accordingly, there is a need in the art for a USB isolator with expanded capabilities.

DETAILED DESCRIPTION

A USB-based isolator system conveys USB signals between a pair of galvanically isolated circuit systems and supports controlled enumeration by a downstream device on upstream USB signal lines. The isolator system provides a multi-mode voltage regulator to support multiple voltage supply configurations. The isolator system further provides control systems for each of the isolated circuit systems and provides robust control in a variety of start up conditions. Additionally, the isolator system includes refresh timers and watchdog mechanisms to support persistent, power-efficient operation, and manage possible communication errors that can arise between the isolated circuit systems.

Figure 1:
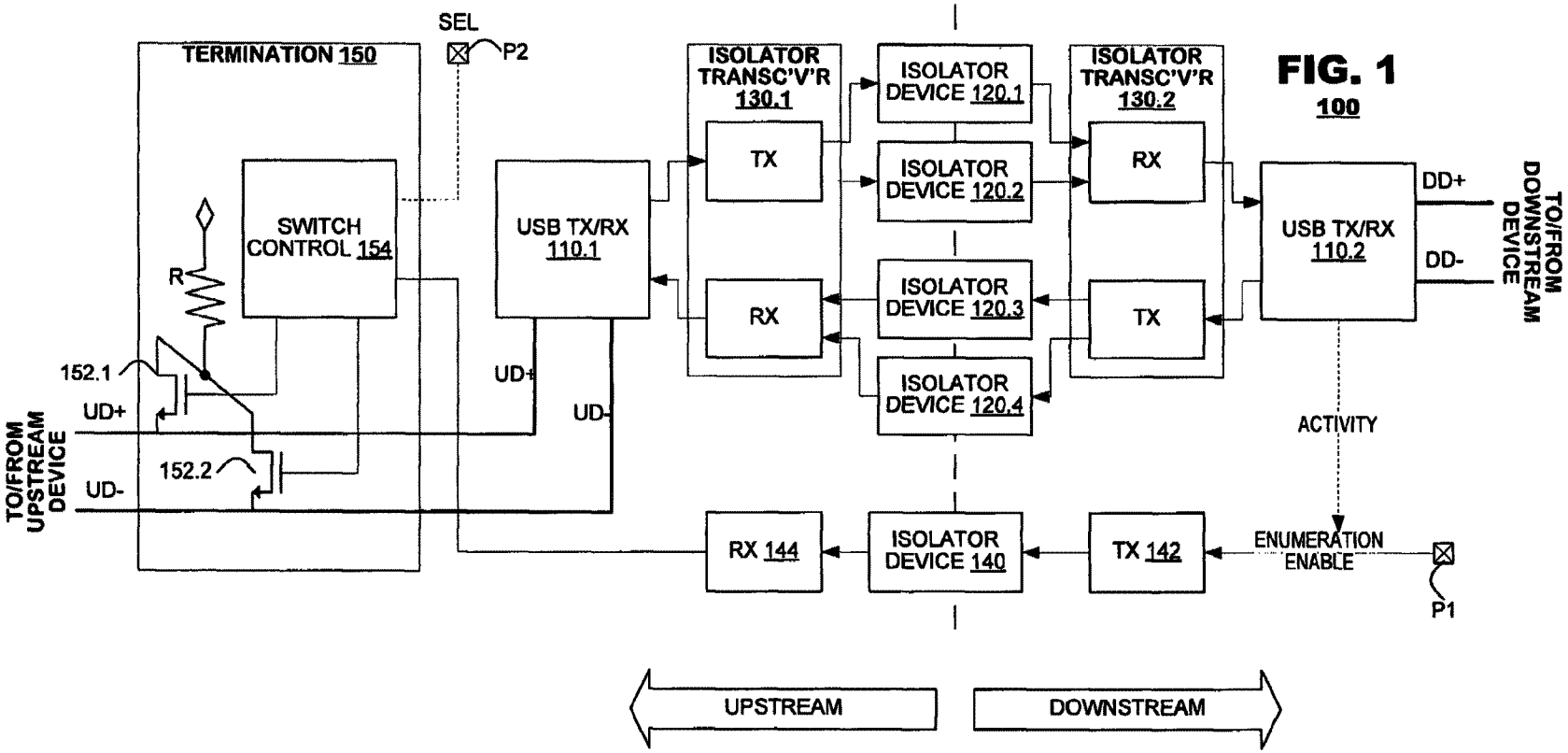
FIG. 1 is a block diagram of a USB isolation system according to an embodiment of the present invention.

FIG. 1 is a simplified block diagram of a USB isolation system 100 according to an embodiment of the present invention. The isolator system 100 may include a pair of USB transceivers 110.1, 110.2, a plurality of isolator devices 120.1-120.4, 140, a pair of isolator transceivers 130.1-130.2 and an upstream termination circuit 150 to support a run time data path through the isolator. The isolator devices 120.1-120.4, 140 provide data exchange between two galvanically isolated circuit sub-systems, called the 'upstream' side and 'downstream' side respectively, across an isolation barrier. Thus the USB transceiver 110.1, isolator transceiver 130.1 and upstream termination circuit 150 are connected to power supplies and ground references that are separate from the power supplies and ground references of USB transceiver 110.2 and isolator transceiver 130.2. Isolator devices 120.1-120.4 and 140 may be provided as micro-transformers, photo emitters/detectors, capacitors or giant magneto resistive (GMR) couplers.

As illustrated in FIG. 1, the isolation system 100 couples to an upstream device via a first USB bus and to a downstream device via a second USB bus. Commonly, the upstream device will be a USB hub or USB host and the downstream device will be an application-specific peripheral device. The downstream device also may be a USB hub. In one application, the downstream device and the isolator system 100 will be provided together in a larger, unitary device (called a "consumer device" herein) in a common housing. From an operator's perspective, the consumer device may connect to an upstream device via a USB interface provided on the upstream side of the isolation barrier. In these consumer device applications, the isolator system 100 and the downstream USB interface likely will not be perceptible to the operator. Indeed, the USB interface between the isolator system 100 and the downstream device may be provided on a printed circuit board or within an integrated circuit.

The USB transceivers 110.1, 110.2 support bi-directional data communication across connected differential signal lines (UD+/UD− and DD+/DD−) according to the USB protocol. The USB transceivers 110.1, 110.2 recognize various transmission states from data transmitted across the USB signal lines and output received signals to respective isolator transceivers 130.1, 130.2. The isolator transceivers 130.1, 130.2 support bi-directional communication over the isolator devices 120.1-120.4. For example, the isolator transceivers 130.1, 130.2 may convert signals received from the associated USB transceiver 110.1, 110.2 into a form for transmission over the isolator devices 120.1-120.4. The isolator transceivers 130.1, 130.2 also may convert the signals received from the isolator devices 120.1-120.4 into a form for transmission to an associated USB transceiver 110.1, 110.2. In an embodiment, the system 100 will include two pairs of unidirectional isolator devices 120.1-120.2, 120.3-120.4, one pair to support communication in the downstream direction and another pair to support communication in the upstream direction. In such a case, the isolator transmitter units and isolator receiver units are provided in a paired relationship with a corresponding pair of isolator channels (e.g., the isolator transmitter in transceiver 130.1 generates isolator signals for transmission across isolator devices 120.1-120.2 and for reception by the isolator receiver in transceiver 130.2).

Although not illustrated in FIG. 1, it is permissible to use a single pair of isolator devices 120.1-120.2 and operate them bi-directionally. In this case, the transmitter and receiver units of both isolator transceivers 130.1, 130.2 may be coupled to both isolator devices 120.1-120.2. The transmitter and receiver units in such an embodiment would be managed to transmit data in a half-duplex manner to avoid contention at the isolator devices 120.1-120.2 themselves (e.g., only one direction at a time).

According to an embodiment of the present invention, the isolator system 100 also may include an isolator device 140, transmitter 142 and receiver 144 and termination circuit 150 to support enumeration control. The termination circuit 150 may be attached to a connector port into which a USB cable would be inserted. The termination circuit 150 may include one or more pull up resistors R connected to a voltage source (V), a pair of switches 152.1, 152.2 to selectively connect a pull up resistor to one of the upstream USB signal lines UD+ or UD−. The size of the pull up resistors R may be determined by the governing USB standard (e.g., 1.5 kΩ for USB 2.0). Connection of the pull up resistor R to the signal lines is controlled by a switch controller 154 which, in turn, is controlled by an 'enumeration enable' signal received on a downstream side of the isolator system 100 and a selection signal (SEL). The selection signal may identify which of the two signal lines UD+ or UD− will be connected to the pull up resistor R. The enumeration enable signal may control timing—when the respective signal line is connected to the pull up resistor R.

As noted, the enumeration enable signal may be received on a downstream side of the isolator system 100. The enumeration enable signal may be received from a downstream peripheral device (not shown) as an express signal; in this case, the isolator system 100 may include an external pin P1 to receive the enumeration enable signal from the peripheral device. Alternatively, the enumeration enable signal may be derived by the downstream transceiver USB 110.2 from activity detected on the downstream USB signal lines DD+ and DD− (shown in phantom in FIG. 1). In the configuration of FIG. 1, the enumeration enable signal may be transmitted across an isolation barrier via a separately provisioned downstream transmitter 142, an isolator device 140 and an upstream receiver 144. Other configurations do not require a separately-provisioned isolator device as discussed below.

As illustrated in FIG. 1, the selection signal SEL may be generated on the upstream side of the isolator. For example, the selection signal may be received via an external pin P2 of the isolator 100 or may be hard-wired to a predetermined state. Alternatively, the selection signal may be generated on the downstream side of the isolator, via input to another external pin (not shown), or via derivation by the downstream transceiver USB 110.2 from activity detected on the downstream USB signal lines DD+ and DD−. In such a case, the selection signal may be merged with the enumeration signal for transmission over an isolator device 140 to the termination circuit 150.

Consider the isolator device 100 in operation. Run time operation may be initiated when a downstream peripheral device is first turned on or connected to the upstream device via the upstream USB bus. It is expected that the downstream peripheral device may undertake its own boot up/self test procedure. These procedures, therefore, may define some latency between the time it is turned on to the time the downstream peripheral device is ready to receive data.

When the downstream device is ready to receive data, it may assert the enumeration enable signal to the isolator system 100. The enumeration enable signal propagates through the isolator transmitter unit 142, the isolator device 140 and the isolator receiver unit 144. The isolator transmitter unit may perform signal conversion to condition the signal for transmission via the isolator device 140. The isolator receiver unit 144 may generate a recovered enumeration enable signal from the signal received from the isolator device 140. The recovered enumeration signal is output to the switch control logic 154. The switch control logic 154 may close one of the transistor switches 152.1, 152.2 when it receives the recovered enumeration signal (say, switch 152.2). Closing the switch connects a pull up resistor R to the selected bus line (for example, UD− when switch 152.2 is closed), which signals the upstream device that a device is connected and enumeration should proceed. Accordingly, upstream enumeration control is provided for a downstream device in the isolator system 100.

Figure 2:
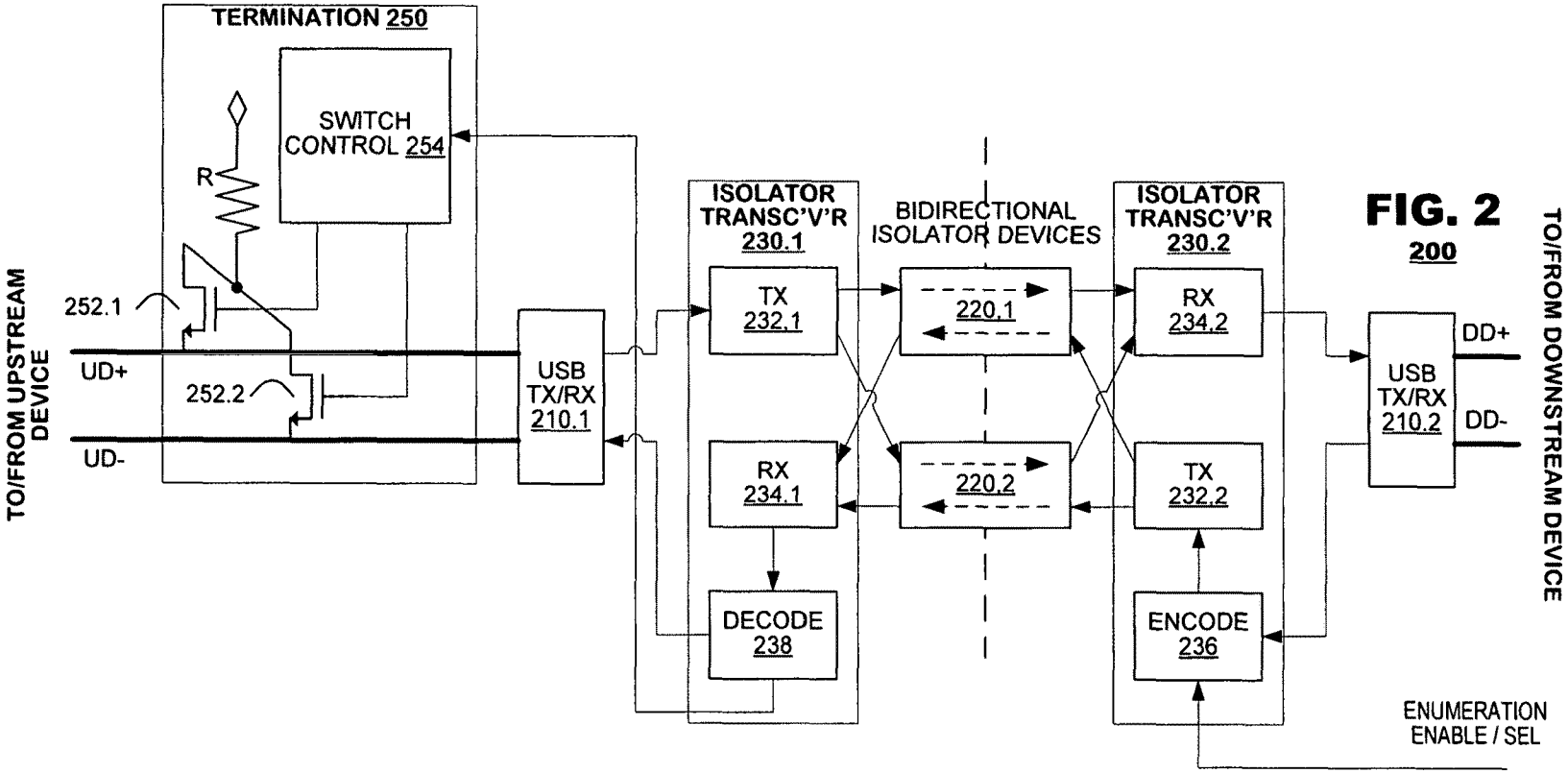
FIG. 2 is a block diagram of a USB isolation system according to another embodiment of the present invention.

FIG. 2 illustrates another isolator system 200 according to an embodiment of the present invention. The isolator system 200 may include a pair of USB transceivers 210.1, 210.2, a plurality of isolator devices 220.1-220.2, a pair of isolator transceivers 230.1-130.2 and an upstream termination circuit 250. The isolator devices 220.1-120.2 provide data exchange between two galvanically isolated circuit subsystems across an isolation barrier, again called the 'upstream' side and 'downstream' side respectively. Thus, the USB transceiver 210.1, isolator transceiver 230.1 and upstream termination circuit 250 are connected to power supplies and ground references that are separate from the power supplies and ground references of USB transceiver 210.2 and isolator transceiver 230.2. Isolator devices 220.1-220.2 may be provided as bi-directional isolation devices such as capacitive or inductive couplers. In one example, the bidirectional isolator devices 220.1-220.2 may be provided as micro-transformers provided on an integrated circuit substrate. As in the FIG. 1 embodiment, the isolator system 200 may couple to an upstream device via a first USB bus and to a downstream device via a second USB bus.

The USB transceivers 210.1, 210.2 support bi-directional data communication across connected differential signal lines (UD+/UD− and DD+/DD−) according to the USB protocol. The USB transceivers 210.1, 210.2 recognize various transmission states from data transmitted across the USB signal lines and output logic signals to respective isolator transceivers 230.1, 230.2. The isolator transmitter units 232.1, 232.2 may convert input logic signals into a form appropriate for transmission via the isolator devices 220.1, 220.2. The isolator receiver units 234.1, 234.2 may convert signals received from the isolator devices into logic signals. In the embodiment illustrated in FIG. 2, the isolator transceivers 230.1, 230.2 support bi-directional communication over the isolator devices 220.1, 220.2. The transmitter and receiver units of both isolator transceivers 230.1, 230.2 are shown coupled to both isolator devices 220.1, 220.2. The isolator transceivers 230.1, 230.2 transmit data in a half-duplex manner to avoid contention at the isolator devices 220.1, 220.2 (e.g., only one direction at a time).

The embodiment shown in FIG. 2 allows the enumeration enable signal and the selection signal SEL to "share" the isolator devices 220.1, 220.2 that carry the USB data signals. To accommodate this architecture, the downstream isolator transceiver 230.2 may include a signal encoder 236 that accepts the logical signals from the USB transceiver 230.2, the enumeration enable signal and the selection signal SEL. The encoder 236 may generate a pattern of signals for transmission via the isolator devices 220.1, 220.2 in a manner to preserve the state of the ordinary runtime USB data signals, the enumeration enable signal and the selection signal SEL. The upstream transceiver 230.1 may include a decoder 238 to decode signals recovered by the receiver unit 234.1 and distinguish run time USB signals from the enumeration enable signal and the selection signal SEL. The decoder may route the USB signals to the USB transceiver 210.1 and the enumeration enable signal to the termination circuit 250.

Figure 3:
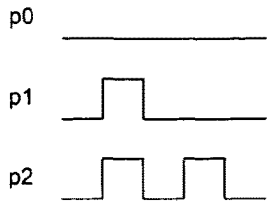
FIG. 3 illustrates exemplary signals for transmission across an isolator according to an embodiment of the present invention.

When micro-transformers are used, pulse signals are convenient signals to be transmitted across an isolation barrier. To accommodate the shared isolator configuration of FIG. 2, different pulse waveforms may be used, such as those shown in FIG. 3. Further description of the pulse waveforms and the manner of generating them is available in co-pending application Ser. No. 12/414,756, filed Mar. 31, 2009.

When two isolator channels are used, the pulse patterns may be combined in a variety of ways. Table 1 illustrates one possible configuration. In this configuration, at least 4 pulse combinations may be reserved to represent the information content that may be carried via the USB run time signals. Other combinations may be used to identify assertion or de-assertion of the enumeration enable signal and the type of selection used.

TABLE 1

| CHANNEL 1 | CHANNEL 2 | USB D+ | USB D− | ENUMERATION ENABLE | SEL [SPEED] | (USB 'STATE') |
|---|---|---|---|---|---|---|
| p1 | p0 | 0 | 0 | 1 | 1 (full) | SE0 |
| p0 | p2 | 0 | 1 | 1 | 1 (full) | K |
| p0 | p1 | 1 | 0 | 1 | 1 (full) | J |
| p2 | p0 | x | x | 0 | x | disconnect |
| p1 | p1 | 0 | 0 | 1 | 0 (low) | SE0 |
| p1 | p2 | 0 | 1 | 1 | 0 (low) | J |
| p2 | p1 | 1 | 0 | 1 | 0 (low) | K |
| p2 | p2 | 1 | 1 | Not specified: preserve previous state of 'resistor connect' and 'speed signals' | | SE1 |
| p0 | p0 | | | UNUSED | | |

In Table 1, 'X' denotes a don't care condition. Moreover, the 'disconnect' state indicates the pull up resistor is to be disconnected and the USB transmitters are to be placed in a high impedance state (not driving the data lines).

Table 2 illustrates another configuration in which pulse assignments are likely to conserve power as compared to the Table 1 case.

TABLE 2

| CHANNEL 1 | CHANNLE 2 | USB D+ | USB D− | ENUMERATION ENABLE | SEL [SPEED] | (USB 'STATE') |
|---|---|---|---|---|---|---|
| p1 | p0 | 1 | 0 | 1 | 1 (full) | J |
| p0 | p2 | 0 | 1 | 1 | 0 (low) | J |
| p0 | p1 | 0 | 1 | 1 | 1 (full) | K |
| p2 | p0 | 1 | 0 | 1 | 0 (low) | K |
| p1 | p1 | x | x | 0 | x | disconnect |
| p1 | p2 | 0 | 0 | 1 | 1 (full) | SE0 |
| p2 | p1 | 0 | 0 | 1 | 0 (low) | SE0 |
| p2 | p2 | 1 | 1 | not specified: preserve previous state of 'resistor connect' and 'speed signals' | | SE1 |
| p0 | p0 | | | UNUSED | | |

Again, 'X' denotes a don't care condition. Generally, the 'J' and 'K' states are the most frequently used over long periods of operation. To save power, the 'J' and 'K' states are assigned to {channel 1, channel 2} states with minimal pulse activity. SE0 is used much less frequently and, therefore, it is assigned to a {channel 1, channel 2} state with somewhat more pulse activity. SE1 occurs rarely and therefore is assigned to a maximum power {channel 1, channel 2} state.

Consider the isolator device 200 in operation. Again, it is expected that a downstream peripheral device may undertake its own boot up/self test procedure. These procedures, therefore, may define some latency between the time it is turned on to the time the downstream peripheral device is ready to receive data. When the downstream device is ready to receive data, it may assert the enumeration enable signal and the selection signal to the isolator system 200. The enumeration enable and selection signals propagate through the isolator transceiver encoder 236, isolator transmitter unit 232.2, the isolator device 220 and the isolator receiver unit 234.1. The isolator transmitter unit may perform signal conversion to condition the signal for transmission via the isolator device 220. The isolator receiver unit 234.1 may generate a recovered enumeration enable and selection signals from the signal received from the isolator device 220. The recovered enumeration and selection signals are output to the switch control logic 254. The switch control logic 254 may close one of the transistor switches 252.1, 252.2 when it receives the recovered enumeration signal (say, switch 252.2). Closing the switch connects the pull up resistor R to the selected bus line (UD−), which signals the upstream device that a device is connected and enumeration should proceed. Accordingly, upstream enumeration control is provided for a downstream device in the isolator system 200.

As noted above, it is expected that the isolator system and downstream device will be provided as components of a larger consumer device. They may be provided within a common housing. The USB interface provided between the isolator system and the downstream device may not be perceptible to operators of the consumer device. In such implementations, it may not be necessary to provide an interface between the isolator system and the downstream device that conforms to all of the requirements of the USB interface.

A conventional Type A USB connection includes a conductor that is powered at 5 volts. The 5V conductor is powered by a hub device, which permits downstream devices to power themselves from the USB conductor. By contrast, Type B USB connections are prohibited from providing power to the 5V conductor. As noted above, it is expected that the USB isolator proposed herein will be included within a unitary consumer device; it may not be known whether the USB connection to the downstream device will be of Type A or Type B. If Type B connections are to be used, it may be inconvenient for the consumer device to include the 5V conductor of a Type A connection, particularly if the isolator would not use the 5V conductor—it is to be powered from an intermediate voltage (say, 3.3 V). Accordingly, in an embodiment of the present invention, the isolator is designed to be powered by the 5V potential mandated by the USB specification or from the intermediate potential.

Figure 4:
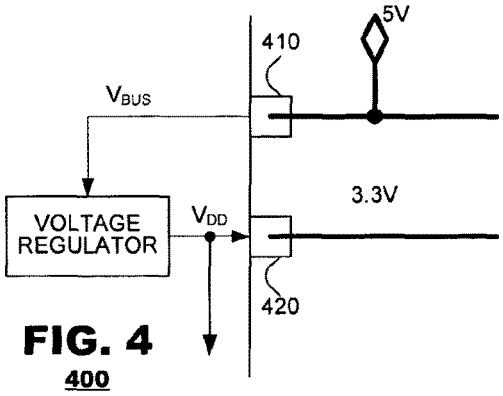
FIGS. 4-5 illustrate exemplary configurations for a voltage regulator of an isolation system suitable for use with embodiments of the present invention.
Figure 5:
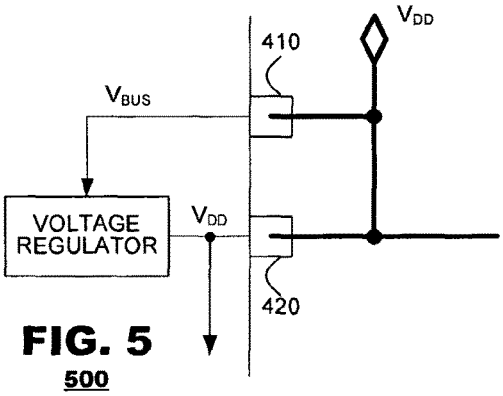

Connection configurations may vary as shown in FIGS. 4 and 5. In both configurations, the isolator chip has pins 410, 420 for a $V_{BUS}$ connection and a $V_{DD}$ connection. In the FIG. 4 configuration, the $V_{BUS}$ pin 410 is connected to a 5V source in a manner consistent with the USB protocol. Circuit designers would expect the isolator's voltage regulator to drive a pin 420 with a voltage at $V_{DD}$. In the FIG. 5 configuration, the $V_{BUS}$ and $V_{DD}$ pins 410, 420 are connected to a $V_{DD}$ source. Circuit designers would expect the isolator's voltage regulator not to drive pin 420. As proposed below, an isolator system may include a multi-mode voltage regulator to satisfy these expectations.

Figure 6:
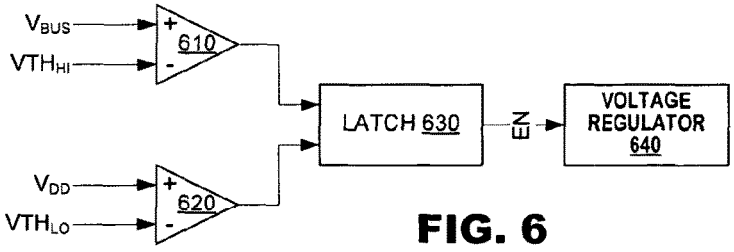
FIG. 6 illustrates a voltage regulator control system according to an embodiment of the present invention.

FIG. 6 illustrates a control system 600 for an on chip voltage regulator 640. The control system may include a pair of comparators 610, 620 and a latch 630. The latch 630 may generate a control output to the voltage regulator 640 to enable it or disable it dynamically in response to voltages sensed at the $V_{BUS}$ and $V_{DD}$ pins of the isolator. A first comparator 610 may compare the $V_{BUS}$ voltage to a first predetermined threshold, $VTH_{HI}$. A second comparator 620 may compare the $V_{DD}$ voltage to a second predetermined threshold, $VTH_{LO}$. The latch 630 can be implemented as a set/reset latch, with the set input coupled to the first comparator 610 and the reset input coupled to the second comparator 620.

Voltage regulator control may be accomplished via the following rules:

- If $V_{BUS}>VTH_{HI}$ AND $V_{DD}<VTH_{LO}$, then the voltage regulator is enabled.
- If $V_{BUS}<VTH_{HI}$ AND $V_{DD}>VTH_{LO}$, then the voltage regulator is disabled.
- If $V_{BUS}>VTH_{HI}$ AND $V_{DD}>VTH_{LO}$, then prior operation of the voltage regulator is maintained.
- If $V_{BUS}<VTH_{HI}$ AND $V_{DD}<VTH_{LO}$, the voltage regulator is disabled.

As noted, the operational control may be accomplished by a set/reset latch. Alternatively, the rules could be coded into a state machine, which generates control outputs to the voltage regulator as described above.

In practice, the threshold voltages $VTH_{HI}$ and $VTH_{LO}$ can be set to intermediate levels surrounding the expected $V_{DD}$ values. For example, consider a system in which $V_{DD}$ is 3.3 V and $V_{BUS}$ of a USB bus is 5V. $VTH_{HI}$ may be set to an intermediate potential between $V_{DD}$ and $V_{BUS}$, for example, 4.2V. $VTH_{LO}$ may be set to a potential close to but lower than $V_{DD}$, such as 2.9V.

Figure 7:
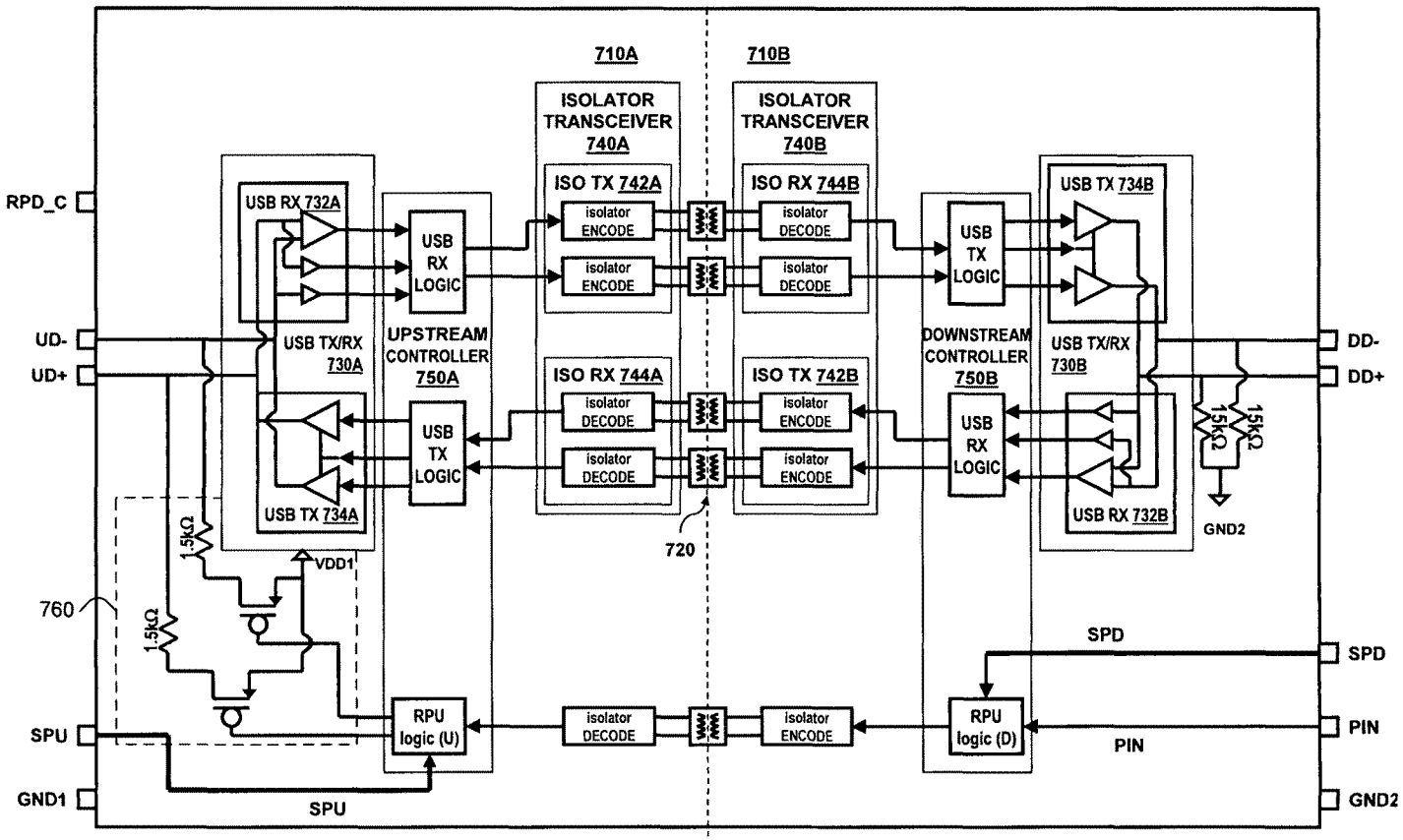
FIG. 7 is a block diagram of a USB isolation system according to another embodiment of the present invention.

FIG. 7 is a block diagram of an isolator system 700 according to another embodiment of the present invention. The isolator system may include two galvanically isolated circuit sub-systems 710A, 710B coupled via isolation devices 720. The circuit systems 710A, 710B may operate according to separate source potentials and separate grounds. The system may include, in each of the isolated circuit sub-systems 710A, 710B: respective USB transceiver units 730A, 730B, respective isolator transceivers 740A, 740B and respective controllers 750A, 750B. The USB transceiver units 730A, 730B may provide an interface to respective USB signal lines. The USB transceivers may include respective USB receivers 732A, 732B and USB transmitters 734A, 734B. The respective isolator transceivers 740A, 740B may perform signal conditioning to transfer signals across the isolation devices 720 and may include isolator transmit circuits 742A, 742B and isolator receive circuits 744A, 744B. The controllers may coordinate communication between respective USB transceivers 730A, 730B and isolator transceivers 740A, 740B.

FIG. 7 also illustrates a termination circuit 760 that includes a pair of pull up resistors coupled to respective USB data lines, illustrated as UD+ and UD−. In this embodiment, one of the pull up resistors will be switched to its respective data line to initiate enumeration. Further in this embodiment, the enumeration control signal may be received via the PIN input and the switch selection may be made by the SPD and SPU signals in combination with each other. The SPD and SPU signals permit selection of the USB data line to be made via both the upstream and downstream circuit systems. The selections should agree with each other before enumeration begins. An RPU logic unit 752 in the upstream controller 750A may control operation of the termination circuit 760.

Alternatively, enumeration can be controlled by providing a voltage monitor on the downstream USB interface (not shown). The downstream USB interface 730B includes its own pull down resistors coupled to the DD+/DD− signal lines. A counterpart pull up resistor may be provided at the downstream device which, when connected to one of the D+/D− signal lines, indicates that enumeration may commence and further indicates a speed of the USB connection. When the pull up resistor is connected, a voltage monitor (not shown) at the isolator's downstream USB receiver 732B may detect a voltage change, identify the signal line to which the downstream peripheral device connected its pull up resistor, and relay the information to the upstream termination circuit 760 to cause a similar connection to be made.

In addition to providing controlled USB enumeration, the two circuit sub-systems 710A and 710B work together in coordinated fashion to properly start up, to recover from error conditions, and to manage transmission of USB data back and forth across the isolation devices. To accomplish these control goals, communication between the systems is provided.

There are several associated challenges. First, each circuit sub-system can have its own power supply voltage, and any order of power supply startup is possible (e.g., the upstream-side power supply may start first or the downstream-side power supply may start first). There may be times when only one circuit sub-system 710A or 710B is powered while the other is not, but for all possible startup sequences, the complete system 700 should be working properly by the time both circuit sub-systems 710A and 710B are fully powered. The system 700 should also work during and recover from periods in which one sub-system is fully powered but in the other, the power supply is cycled off and on.

A second challenge arises because the sub-systems are largely isolated from each other, except for limited communication through the isolation devices 720, which have a primary purpose of communicating USB serial data. Although additional, separate isolation devices could be provided to communicate extra 'control' information to achieve the control goals, the extra devices would increase die area and cost. Accordingly, it is desired to provide control circuits and communication methods that achieve the control goals using only existing isolator devices 720.

Finally, it is desirable for the sub-system 710A to consume power below a suspend current threshold of 2.5 mA when the system 700 is fully powered but USB busses are idle. This avoids need for a special low-power 'suspend' mode, or circuitry to control transitions between the suspend mode and a normal, non-suspended operating mode. FIGS. 8-12 depict controller and isolator circuits and techniques, according to an embodiment of the present invention, to achieve the control goals with minimal power consumption, complexity, and use of isolation devices.

Figure 8:
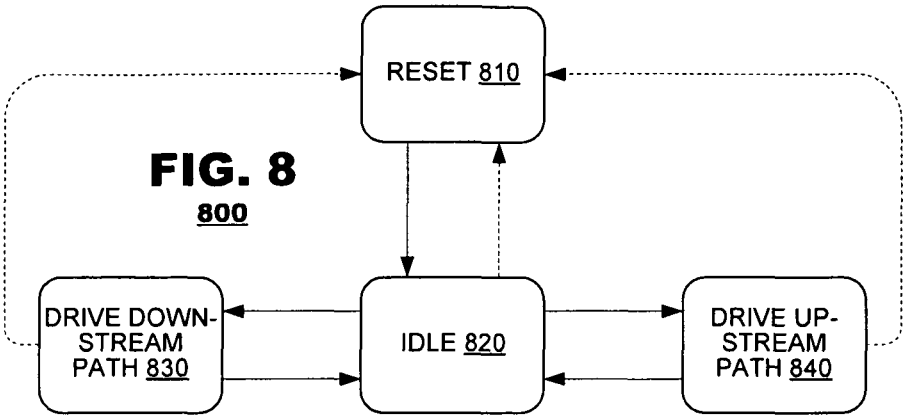
FIG. 8 is a state diagram of an upstream controller according to an embodiment of the present invention.

FIG. 8 is a state diagram illustrating operation of the upstream controller 750A of FIG. 7 according to an embodiment of the present invention. As shown in FIG. 8, the upstream controller may operate according to four states:

RESET 810: In this state, the controller disables the isolator receiver 744A, isolator transmitter 742A and USB transmitter 734A.

IDLE 820: In this state, the controller enables the isolator receiver, enables the isolator transmitter, and disables the USB transmitter.

DRIVE DOWNSTREAM PATH 830: In this state, the controller disables the isolator receiver, enables the isolator transmitter and disables the USB transmitter.

DRIVE UPSTREAM PATH 840: In this state, the controller enables the isolator receiver, disables the isolator transmitter, and enables the USB transmitter.

The RESET state 810 may be reached whenever the controller detects error conditions such as voltage underflows or when the isolator determines an enumeration pull up resistor in the upstream USB interface should be disconnected. The RESET state 810 can be reached from any other state whenever these conditions occur.

The IDLE state 820 can be reached from the RESET state 810 when error conditions discontinue and the enumeration pull up resistor is connected. The IDLE state 820 can be reached from the DRIVE UPSTREAM PATH state 840 when no error conditions are occurring and an end of packet condition or watchdog timeout condition occurs (as discussed below). The IDLE state 820 also can be reached from the DRIVE DOWNSTREAM PATH state 830 when no error conditions are occurring, and an end of packet condition occurs.

The DRIVE DOWNSTREAM PATH state 830 can be reached from the IDLE state 820 when no error conditions are occurring, the controller detects the arrival of data from the USB receiver 732A, or a refresh timer expires (as discussed below). Once the controller enters the DRIVE DOWNSTREAM PATH state 830, it may remain in the state until an end of packet signal (EOP) is encountered in the transmitted signal or an error condition occurs. When an EOP is encountered in the absence of errors, the controller may return to the IDLE state 820.

The DRIVE UPSTREAM PATH state 840 can be reached from the IDLE state 820 when no error conditions are occurring and the controller detects the arrival of data from the isolator receiver 744A. Once the controller enters the DRIVE UPSTREAM PATH state 840, it may remain in the state until an EOP is encountered, or a watchdog timeout occurs, or an error condition occurs. When an EOP is encountered or watchdog timeout occurs in the absence of errors, the controller may return to the IDLE state 82.

Figure 9:
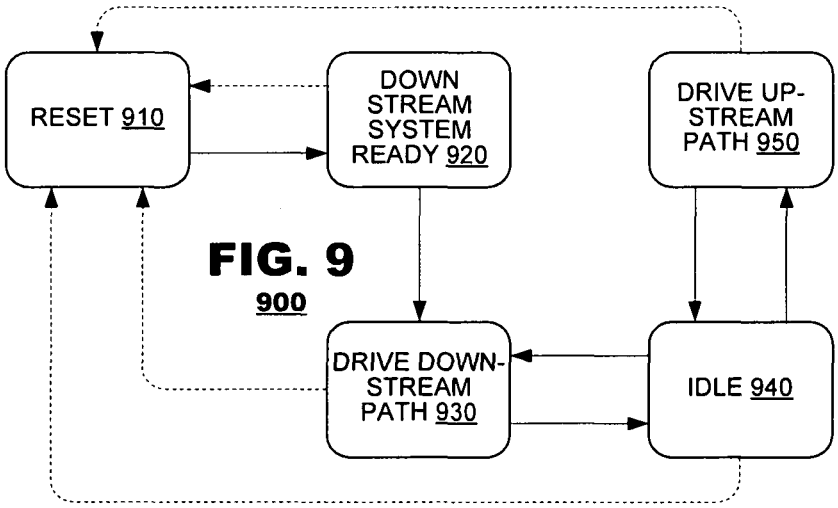
FIG. 9 is a state diagram of a downstream controller according to an embodiment of the present invention.

FIG. 9 is a state diagram illustrating operation of the downstream controller 750B of FIG. 7 according to an embodiment of the present invention. As shown in FIG. 9, the downstream controller 750B may operate according to five states:

RESET 910: In this state, the controller disables the isolator receiver 744B, isolator transmitter 742B and the USB transmitter 734B.

DOWNSTREAM SYSTEM READY 920: In this state, the controller enables the isolator receiver, disables the isolator transmitter and disables the USB transmitter.

DRIVE DOWNSTREAM PATH 930: In this state, the controller enables the isolator receiver, disables the isolator transmitter, and enables the USB transmitter.

IDLE 940: In this state, the controller enables the isolator receiver and isolator transmitter, and disables the USB transmitter.

The RESET state 910 may be reached whenever the controller detects error conditions such as voltage underflows or when the isolator determines an enumeration pull up resistor in the upstream USB interface should be disconnected. The RESET state 910 can be reached from any other state whenever these conditions occur.

The DOWNSTREAM SYSTEM READY state 920 can be reached from the RESET state 910 when error conditions discontinue and the enumeration pull up resistor is connected. In this state, the downstream controller 750B may determine that the downstream circuit system 710B is operational. The downstream controller 750B has not yet determined that the upstream circuit system 710A is operational.

The DRIVE DOWNSTREAM PATH state 930 can be reached from either the IDLE state 940 or the DOWNSTREAM SYSTEM READY state 920. In both cases, the controller 750B enters the DRIVE DOWNSTREAM PATH state 930 when the controller 750B detects the arrival of data from the isolator receiver 744B, and no error conditions are occurring. Once the controller 750B enters the DRIVE DOWNSTREAM PATH state 930, it may remain in the state until an EOP is encountered or a watchdog timeout occurs, or an error condition occurs. When an EOP is encountered or the watchdog times out in the absence of errors, the controller 750B may transition to the IDLE state 940.

The IDLE state 940 can be reached from the DRIVE DOWNSTREAM PATH state 930 when no error conditions are occurring, and an end of packet condition or watchdog timeout condition occurs. The IDLE state 940 also can be reached from the DRIVE UPSTREAM PATH state 950 when no error conditions are occurring and an end of packet condition occurs.

The DRIVE UPSTREAM PATH state 950 can be reached from the IDLE state 940 when no error conditions are occurring, the controller 750B detects the arrival of data from the USB receiver 732B, or a refresh timer expires. Once the controller 750B enters the DRIVE UPSTREAM PATH state 950, it may remain in the state until an EOP is encountered or until an error condition occurs. When an EOP is encountered in the absence of errors, the controller 750B may return to the IDLE state 940.

Figure 10:
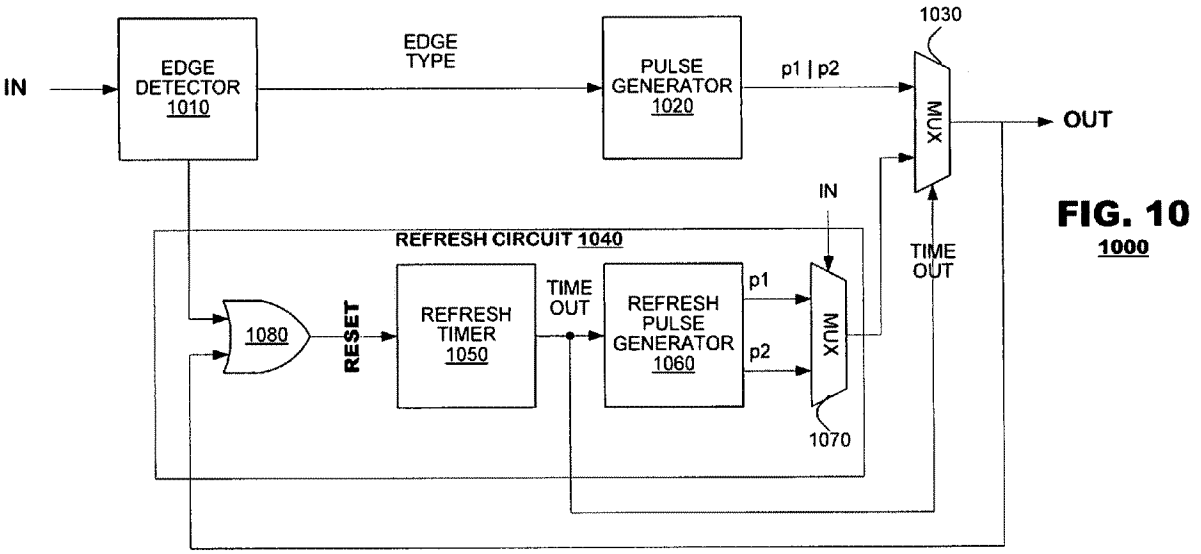
FIG. 10 is a block diagram of an isolator transmitter according to an embodiment of the present invention.

FIG. 10 is a block diagram of an isolator transmitter circuit 1000 according to an embodiment of the present invention. The isolator transmitter circuit may include an edge detector 1010, a pulse generator 1020, a multiplexer 1030 and a refresh circuit 1040. The edge detector 1010 may receive a digital logic signal as an input and may generate an output signal identifying transitions in the input signal and their types (e.g., high to low transitions and low to high transitions). The pulse generator 1020 may generate pulses representing the different types of transitions detected from the input signal. The refresh circuit 1040 may repeat the pulses generated at the pulse generator 1020 at a repeat interval until a new transition is detected in the input signal. The multiplexer 1030 may merge outputs from the pulse generator 1020 and from the refresh circuit 1040 into a unitary signal stream. The output of multiplexer 1030 may be passed to the isolator devices.

In an embodiment, the refresh circuit 1040 may include a refresh timer 1050, a refresh pulse generator 1060, a multiplexer 1070 and an OR gate. The refresh timer 1050 may count down from the time an edge is detected by the edge detector 1010 or from the time of a prior refresh pulse. The OR gate 1080 may reset the refresh timer 1050 when an edge is detected by the edge detector or when a new refresh pulse is output by multiplexer 1030. The refresh pulse generator 1060 may generate pulses when the refresh timer 1050 expires. The refresh pulse generator 1060 may generate both types of pulses (shown as p1, p2) when the refresh timer expires. The multiplexer 1070 may select one of the two pulses output by the refresh pulse generator 1060 based on a level of the input signal. The multiplexer's output may be input to multiplexer 1030.

Figure 11:
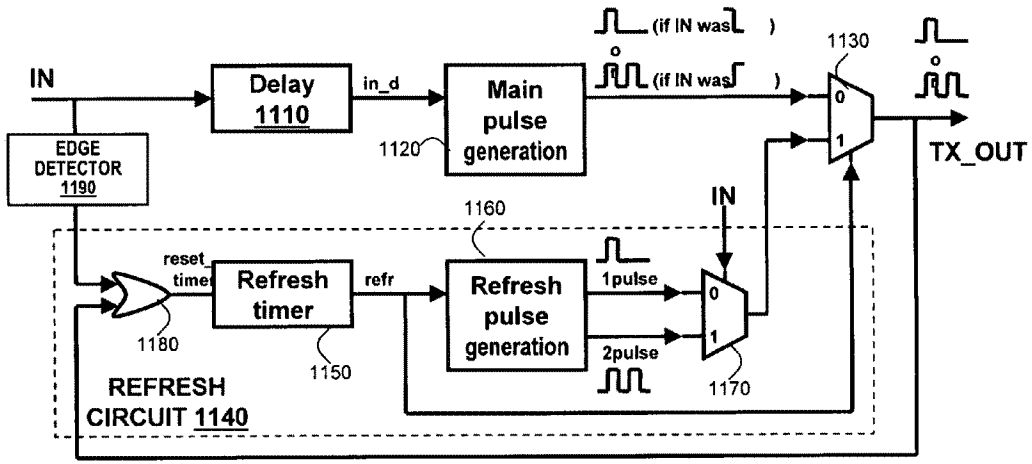
FIG. 11 is a block diagram of an isolator transmitter according to another embodiment of the present invention.

FIG. 11 is a block diagram of an isolator transmitter circuit 1100 according to an embodiment of the present invention. The isolator transmitter circuit may include a delay block 1110, a pulse generator 1120, a multiplexer 1130 and a refresh circuit 1140. The delay block 1110 may receive a digital logic signal and may output the logic signal to the pulse generator 1120 after a predetermined delay. The pulse generator 1120 may generate pulses representing the different types of transitions detected from the delayed input signal. The refresh circuit 1140 may repeat the pulses generated at the pulse generator 1120 at a repeat interval until a new transition is detected in the input signal. The multiplexer 1130 may merge outputs from the pulse generator 1120 and from the refresh circuit 1140 into a unitary signal stream. The output of multiplexer 1130 may be passed to the isolator devices.

In an embodiment, the refresh circuit 1140 may include a refresh timer 1150, a refresh pulse generator 1160, a multiplexer 1170 and an OR gate 1180. The OR gate 1180 may be coupled to the input signal via an edge detector 1190. The refresh timer 1150 may count down from the time an edge is detected in the input signal or from the time of a prior refresh pulse. The OR gate 1180 may reset the refresh timer 1150. The refresh pulse generator 1160 may generate pulses when the refresh timer 1150 expires. The refresh pulse generator 1160 may generate both types of pulses (shown as p1, p2) when the refresh timer expires. The multiplexer 1170 may select one of the two pulses output by the refresh pulse generator 1160 based on a level of the input signal. The multiplexer's output may be input to multiplexer 1130.

Figure 12:
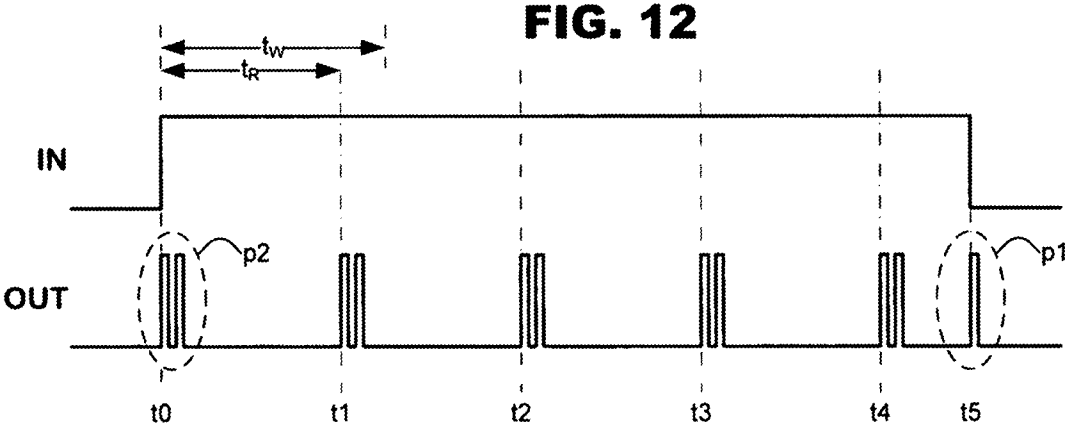
FIG. 12 illustrates exemplary waveforms of an isolator transmitter according to an embodiment of the present invention.

FIG. 12 illustrates exemplary waveforms that may be generated by the isolator transmitter circuits of the foregoing embodiments. For convenience, the following discussion references the structure of FIG. 10 but it applies equally to the structure of FIG. 11. FIG. 12 illustrates an exemplary input signal in which a rising transition occurs at time t0 and in which a descending transition occurs at time t5. At time t0, the pulse generator 1020 may generate a pulse pattern (p2 in this example) which is output by the multiplexer 1030. The multiplexer's output resets the refresh timer 1050. The refresh timer 1050 expires and resets itself at a time period $t_R$. This causes repeat pulses to be output by the multiplexer 1030 at times t1-t4. At time t5, a new transition may be detected by the edge detector 1010, which would cause pulse generator 1020 to generate a new pulse pattern (p1, in this example) representative of the new transition. This also resets refresh timer 1050. Thus, the transmitting isolator transceiver generates refresh pulses at predetermined intervals, which duplicate a pulse generated from an initial transition in the input signal.

An isolator receiver is designed to recognize these pulse patterns and generate corresponding logic transitions. The isolator receiver includes a watchdog timer which is reset if new pulse patterns are received before a 'watchdog' interval $t_W$ elapses. If the watchdog interval elapses without new pulses being received, the watchdog timer expires and a timeout signal is output. The timeout signal can be communicated to a controller such as the ones shown in FIGS. 8-9, and induce a transition to an IDLE state.

The isolator receiver's watchdog interval is longer than the isolator transmitter's refresh interval. Accordingly, in the absence of transmission errors, pulses are input to the receiver at a sufficiently high frequency to prevent the watchdog timer from timing out. Some exceptions exist, however.

In a USB full/low-speed application, it is helpful to send refresh pulses when the logic state of D+ and D− is something besides the 'J' state of the USB 2.0 protocol, and not to send refresh pulses when the state of D+ and D− is 'J'. If the 'J' condition persists for a long time, the watchdog timer will time out, and the receiver's controller will transition to an IDLE state. This is generally desirable as, by convention, USB transmitters are not supposed to actively drive a J onto D+ and D− for arbitrarily long times. Instead, the longest valid 'actively driven' J should be 7 USB bit times. So any J input to the isolator system lasting longer than 7 bit times is probably an undriven 'idle J' that results when no USB transmitters are driving the USB cable, but pull up and pull down resistors are connected and establish the 'J' voltage levels. In the isolator system, the undriven 'idle' J should be copied across the isolation barrier. A simple way to do this without using extra isolator devices is with selective use of the isolator 'refresh' for only non-J inputs, along with a watchdog timer in the isolator receiver, with timeout interval longer than 7 bit times.

This scheme is also useful for error recovery. If valid USB packets are always transmitted without error through the isolator, the isolator receiver's controller should reach the IDLE state following end-of-packet sequences in the USB data stream. However, if the end-of-packet is not detected due to signal transmission error, the USB transmitter might be left on for longer than desirable after the end-of-packet sequence has occurred. With the selective refresh+watchdog timer feature, if the isolator receiver receives a long-lasting J, the USB transmitter is turned off and the controller reaches the IDLE state at a time corresponding to a watchdog interval after the J began, even if no end-of-packet was detected. This prevents the transmitter from remaining stuck indefinitely in an enabled state, when it should actually be disabled.

Another advantage of this scheme is that it saves power. When the USB D+ and D− are in an idle J state in this scheme, no pulses are transmitted in the isolator devices, minimizing power consumption. If the J's were refreshed, power would be consumed in transmitting pulses though the isolator devices.

Figure 13:
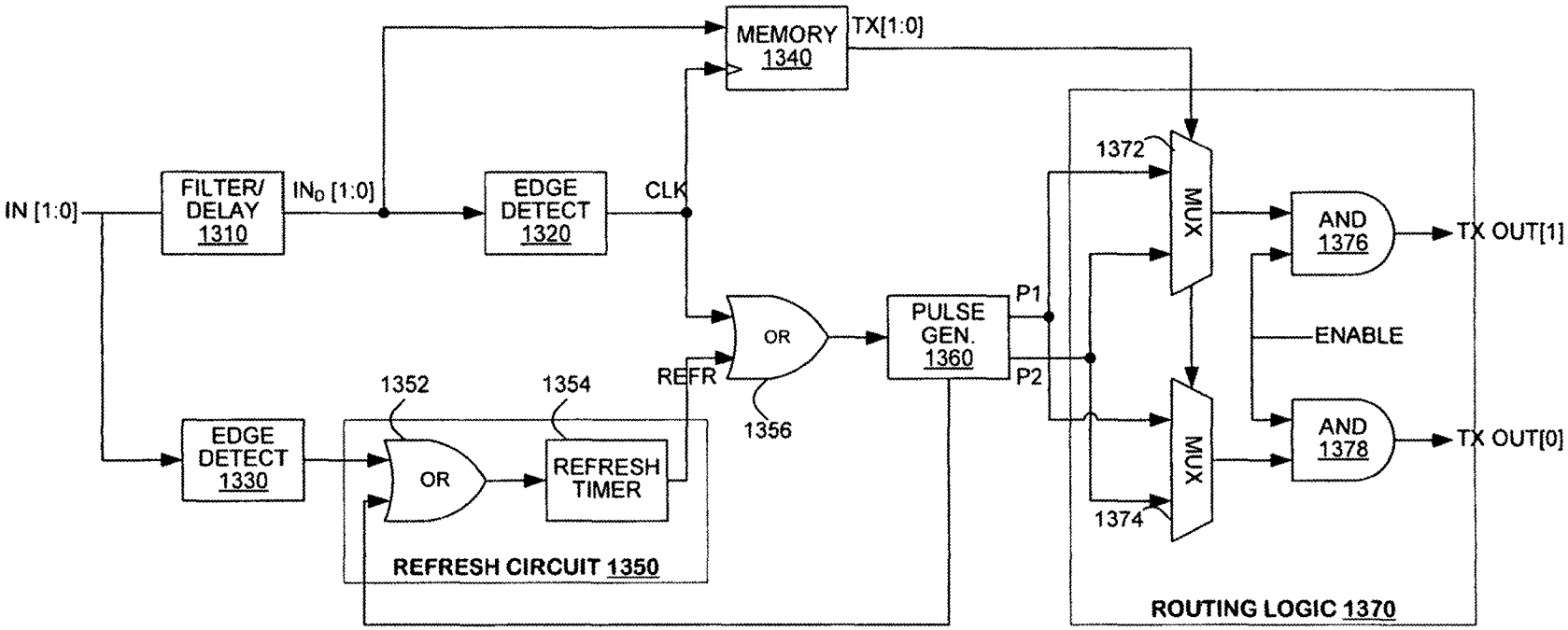
FIG. 13 is a block diagram of an isolator transmitter according to another embodiment of the present invention.

FIG. 13 illustrates an isolator transmitter circuit 1300 according to another embodiment of the present invention. The isolator transmitter 1300 may accept a multi-bit input signal IN[1:0] and generate a multi-bit output signal TX OUT [1:0] in response. The transmitter circuit 1300 may include a delay unit 1310, a pair of edge detectors 1320, 1330, control memory 1340, refresh circuit 1350, pulse generator 1360 and routing logic 1370. The delay unit may delay the input signal by a predetermined delay amount. The edge detector 1320 may detect transitions in the delayed input signal and generate a clock signal therefrom. The clock signal may be output to the memory 1340 and to the pulse generator 1360. An edge detector 1330 similarly may reset the refresh circuit 1350. An output of the refresh circuit 1350 also may be output to the pulse generator 1360.

During operation the pulse generator 1360 may generate several types of pulses (shown as P1, P2) to the routing logic 1370. The memory 1360 may store patterns of configuration data to be output to the routing logic based on the delayed input data. As shown in FIG. 13, the routing logic 1370 may include a pair of multiplexers 1372, 1374 which are controlled by control signals TX[1:0] from the memory 1340. The routing logic 1370 further may include AND gates 1376, 1378, which permit the routing logic 1370 to be selectively enabled or disabled in response to a control signal (ENABLE).

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. An isolation system, comprising:

[a plurality of] *one or more* isolation devices bridging an isolation barrier between an upstream side and a downstream side of the isolation barrier, a USB interface provided on [an] *the* upstream side of the isolation barrier, including a termination circuit having a pull up resistor, an isolator transceiver coupling the USB interface to the isolation devices, and an isolator transmitter provided on [a] *the* downstream side of the isolation barrier *and configured* to [receive an enumeration] *transmit to the upstream side a* control signal *controlling which signal line of a pair of differential signal lines is to be connected to the pull up resistor*, wherein the [enumeration] *isolation system is configured to propagate the* control signal [propagates] through at least one of the *one or more* isolation devices to the upstream side [and controls switching of the pull up resistor in the termination circuit].

2. The isolation system of claim 1, wherein isolation devices are provided for each of a D+ and D− data signal of a USB protocol [and a] separate *from the at least one* isolation device [is] provided for the [enumeration] control signal.

3. The isolation system of claim 1, wherein isolation devices are provided for each of a D+ and D− data signal of a USB protocol, and signals are encoded so the [enumeration] control signal can propagate through said isolation devices along with the D+ and D− data.

4. The isolation system of claim 1, wherein isolation devices are provided for each of a D+ and D− data signal of a USB protocol and are shared with the [enumeration] control signal.

5. The isolation system of claim 1, wherein the *one or more* isolation devices are unidirectional isolation devices.

6. The isolation system of claim 1, wherein the *one or more* isolation devices are bidirectional isolation devices.

7. The isolation system of claim 1, further comprising an input for a selection signal that identifies which one of the D+ and D− data lines is to be connected to the pull up resistor.

8. The isolation system of claim 7, wherein the input is provided on the upstream side of the isolation barrier.

9. The isolation system of claim 7, wherein the input is provided on the downstream side of the isolation barrier.

*10. The isolation system of claim 1, further comprising a pulse generator to generate the control signal, wherein the control signal is a pulse signal.*

*11. The isolation system of claim 1, further comprising a refresh timer to maintain one side of the isolation system in a reception state for communication across the isolation barrier during a watchdog interval.*

*12. A method of communicating in a USB isolation system including a first side and a second side separated by an isolation barrier, comprising:*

*transmitting, from the first side to the second side, a control signal across the isolation barrier through at least one isolation device; and*

*receiving the control signal from the first side; and*

*in response to receiving the control signal, controlling which signal line of a pair of differential signal lines is to be connected to a pull up resistor.*

*13. The method of claim 12, further comprising:*

*at the first side, transmitting D+ and D− data signals of a USB protocol across the isolation barrier through a different isolation device than the one used to transmit the control signal.*

*14. The method of claim 12, further comprising:*

*at the first side, transmitting D+ and D− data signals of a USB protocol across the isolation barrier through the same isolation device used to transmit the control signal.*

*15. The method of claim 14, further comprising:*

*encoding the control signal with the data signals.*

*16. The method of claim 12, further comprising:*

*receiving a selection signal that identifies which of a D+ and D− data lines is to be connected to the pull up resistor.*

*17. The method of claim 16, wherein the selection signal is received on the second side.*

*18. The method of claim 16, wherein the selection signal is received on the first side.*

*19. The method of claim 12, wherein the control signal is a pulse signal.*

*20. The method of claim 12, further comprising:*

*maintaining one side of the USB isolation system in a reception state for communication across the isolation barrier during a watchdog interval.*

*21. An integrated circuit, comprising:*

*an isolation barrier separating a downstream side and an upstream side of the integrated circuit; and*

*one or more isolation devices bridging an isolation barrier between the downstream and upstream sides,*

*the downstream side including an isolator transmitter to transmit a control signal through at least one of the one or more isolation devices to the upstream side,*

*the upstream side including*

*a USB interface including a termination circuit having a pull up resistor,*

*an isolator receiver to receive the control signal transmitted by the isolator transmitter on the downstream side, and*

*a switch controller configured to control which signal line of a pair of differential signal lines is to be connected to the pull up resistor in the termination circuit according to the control signal.*

*22. The integrated circuit of claim 21, wherein isolation devices are provided for each of a D+ and D− data signal of a USB protocol that are separate from the isolation device(s) provided for the control signal.*

*23. The integrated circuit of claim 21, wherein isolation devices are provided for each of a D+ and D− data signal of a USB protocol, and signals are encoded so the control signal can propagate through said isolation devices along with the D+ and D− data.*

*24. The integrated circuit of claim 21, wherein isolation devices are provided for each of a D+ and D− data signal of a USB protocol and are shared with the control signal.*

*25. The integrated circuit of claim 21, wherein the one or more isolation devices are unidirectional isolation devices.*

*26. The integrated circuit of claim 21, wherein the one or more isolation devices are bidirectional isolation devices.*

*27. The integrated circuit of claim 21, further comprising an input for a selection signal that identifies which one of the D+ and D− data lines is to be connected to the pull up resistor.*

*28. The integrated circuit of claim 27, wherein the input is provided on the upstream side of the isolation barrier.*

*29. The integrated circuit of claim 27, wherein the input is provided on the downstream side of the isolation barrier.*

*30. The integrated circuit of claim 21, further comprising a pulse generator to generate the control signal, wherein the enumeration control signal is a pulse signal.*

*31. The integrated circuit of claim 21, further comprising a refresh timer to maintain one side of the integrated circuit in a reception state for communication across the isolation barrier during a watchdog interval.*

* * * * *